(12) United States Patent
Nickel

(10) Patent No.: US 7,397,077 B2
(45) Date of Patent: Jul. 8, 2008

(54) MAGNETIC MEMORY DEVICES HAVING PATTERNED HEATER LAYERS THEREIN THAT UTILIZE THERMALLY CONDUCTIVE SIDEWALL MATERIALS TO INCREASE HEAT TRANSFER WHEN WRITING MEMORY DATA

(75) Inventor: Janice H. Nickel, Sunnyvale, CA (US)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 10/934,922

(22) Filed: Sep. 2, 2004

(65) Prior Publication Data

US 2006/0043444 A1    Mar. 2, 2006

(51) Int. Cl.
*H01L 21/336* (2006.01)
*H01L 21/00* (2006.01)
*G11C 11/14* (2006.01)

(52) U.S. Cl. ............... 257/295; 257/421; 257/E27.006; 438/3; 438/48; 365/171

(58) Field of Classification Search ........... 257/295, 257/421, E27.006; 438/3, 48; 365/171
See application file for complete search history.

(56) References Cited

U.S. PATENT DOCUMENTS

| 6,130,835 A | 10/2000 | Scheurlien |
| 6,724,674 B2 * | 4/2004 | Abraham et al. ............. 365/211 |
| 6,783,999 B1 * | 8/2004 | Lee ................................ 438/3 |
| 2002/0105035 A1 * | 8/2002 | Sandhu et al. ............... 257/375 |
| 2003/0203510 A1 * | 10/2003 | Hineman et al. ............... 438/3 |
| 2004/0135184 A1 * | 7/2004 | Motoyoshi ................... 257/295 |
| 2006/0014305 A1 * | 1/2006 | Lee et al. ........................ 438/3 |

* cited by examiner

*Primary Examiner*—Long K Tran
(74) *Attorney, Agent, or Firm*—Myers Bigel Sibley & Sajovec

(57) ABSTRACT

An aspect of the present invention is a thin film device. The thin film device includes at least one patterned thin film layer, a thermally conductive material coupled to at least one of the patterned thin-film layer and an electrically and thermally isolating material in contact with the thermally conductive material.

3 Claims, 5 Drawing Sheets

MAGNETIC MEMORY DEVICES HAVING PATTERNED HEATER LAYERS THEREIN THAT UTILIZE THERMALLY CONDUCTIVE SIDEWALL MATERIALS TO INCREASE HEAT TRANSFER WHEN WRITING MEMORY DATA

FIELD OF THE INVENTION

The present invention relates generally to thin film devices and more particularly to a thin film device and a method of formation thereof.

BACKGROUND OF THE INVENTION

Consider the example of an MRAM device including a resistive cross point array of spin dependent tunneling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1'. The magnetization orientation, in turn, affects the resistance of the SDT junction. Resistance of the SDT junction is a first value (R) if the magnetization orientation is parallel and a second value (R+ΔR) if the magnetization orientation is anti-parallel.

The magnetization orientation of the SDT junction and, therefore, its logic value may be read by sensing its resistance state. This is conventionally accomplished by sensing the resistance of the bit through the word and bit lines, which, in a resistive cross point array, act as write conductors during write operations, and sense lines during read operations. An alternate configuration utilizes a dedicated sense line in addition to the word and bit lines.

A write operation on a selected SDT junction is performed by supplying write currents to the word and bit lines crossing the selected SDT junction. The currents create two external magnetic fields that, when combined, switch the magnetization orientation of the selected SDT junction from parallel to anti-parallel or vice versa. However, too small a write current might not cause the selected SDT junction to change its magnetization orientation thereby resulting in the occurrence of half-select errors.

Conventional MRAM designs sometimes need two current driven magnetic fields to effectively switch the magnetization orientation and avoid half-select errors. However, the magnitude of the current(s) needed to switch the magnetization orientation of the SDT junction during a write operation should be as small as possible in order maintain the cost advantage of the implementation of the MRAM device.

Accordingly, what is needed is an MRAM device that reduces the current required to switch the magnetic orientation of the magnetic tunnel junction. The device and method should be simple, inexpensive and capable of being easily adapted to existing technology. The present invention addresses this need.

SUMMARY OF THE INVENTION

An aspect of the present invention is a thin film device. The thin film device includes at least one patterned thin film layer, a thermally conductive material coupled to at least one of the patterned thin-film layer and an electrically and thermally isolating material in contact with the thermally conductive material.

Other aspects and advantages of the present invention will become apparent from the following detailed description, taken in conjunction with the accompanying drawings, illustrating by way of example the principles of the invention.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1:
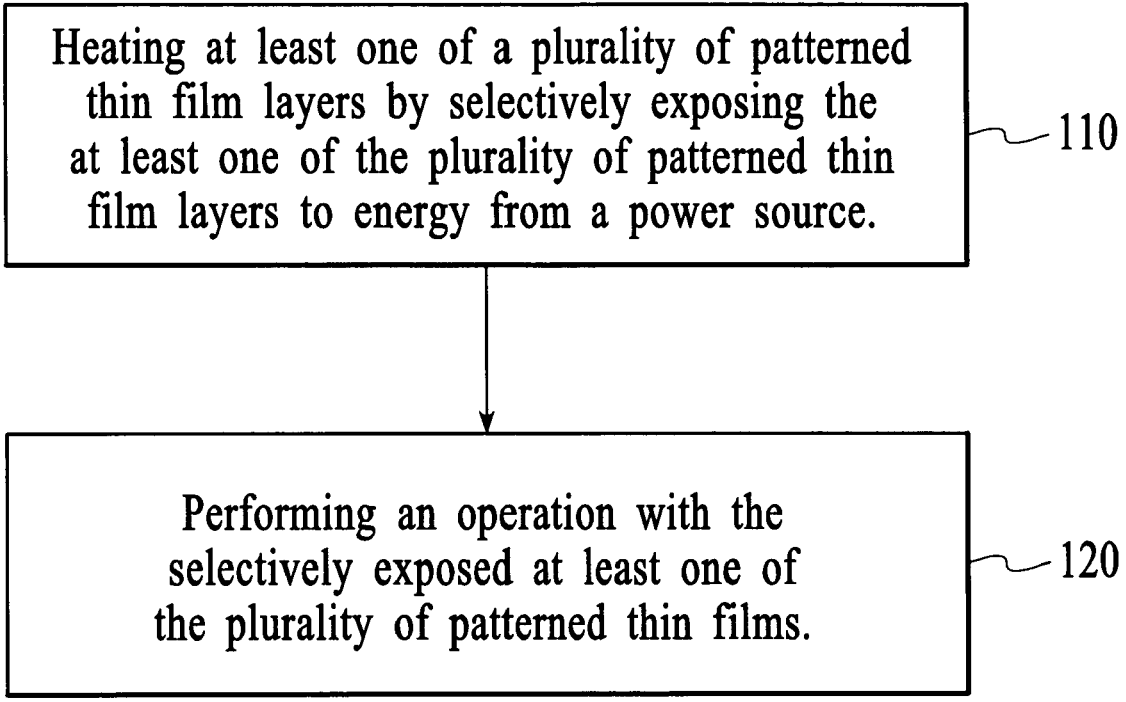
FIG. 1 is a high-level flow chart of a method in accordance with an embodiment of the present invention.

The present invention includes a thin film device and a method of formation thereof. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a thin film device and a method of providing thermal assistance therein is disclosed. Accordingly, a heater material is utilized in conjunction with an electrically isolating and thermally conducting material to thermally assist in the operation of the thin film device. By utilizing a heater material in conjunction with an electrically and thermally isolating material to thermally assist in the operation of the thin film device, a substantial improvement in the accuracy and performance of the thin film device is achieved. In addition, the device can be operated at a lower current thereby lowering the cost of producing such device. Furthermore, employing a electrically isolating and thermally conducting material allows the heater material to be positioned anywhere in the thin film device thereby increasing the flexibility of the fabrication process.

FIG. 1 is a high level flow chart of a method providing thermal assistance in a thin film device. A first step 110 includes heating at least one of a plurality of patterned thin film layers by exposing the at least one of the plurality of patterned thin film layers to energy from a power source. A second step 120 includes performing an operation with the exposed at least one of the plurality of patterned thin films.

The method of providing thermal assistance to a thin film device is a generic method and has applications in many areas. Consider the example of the MRAM thin film device. As shown in the drawings for purposes of illustration, the MRAM device includes a plurality of magnetic memory elements. A magnetic memory element of the MRAM device could be any element having a resistance that is dependent upon the state of its magnetic film. Examples of such elements include magnetic tunnel junctions (the spin dependent tunnel (SDT) junction is a type of magnetic tunnel junction) and giant magnetoresistance ("GMR") spin valves. For the purposes of illustration, the memory elements will be described below as SDT junctions. These elements may also be used for other applications such as magnetic read heads.

Figure 2:
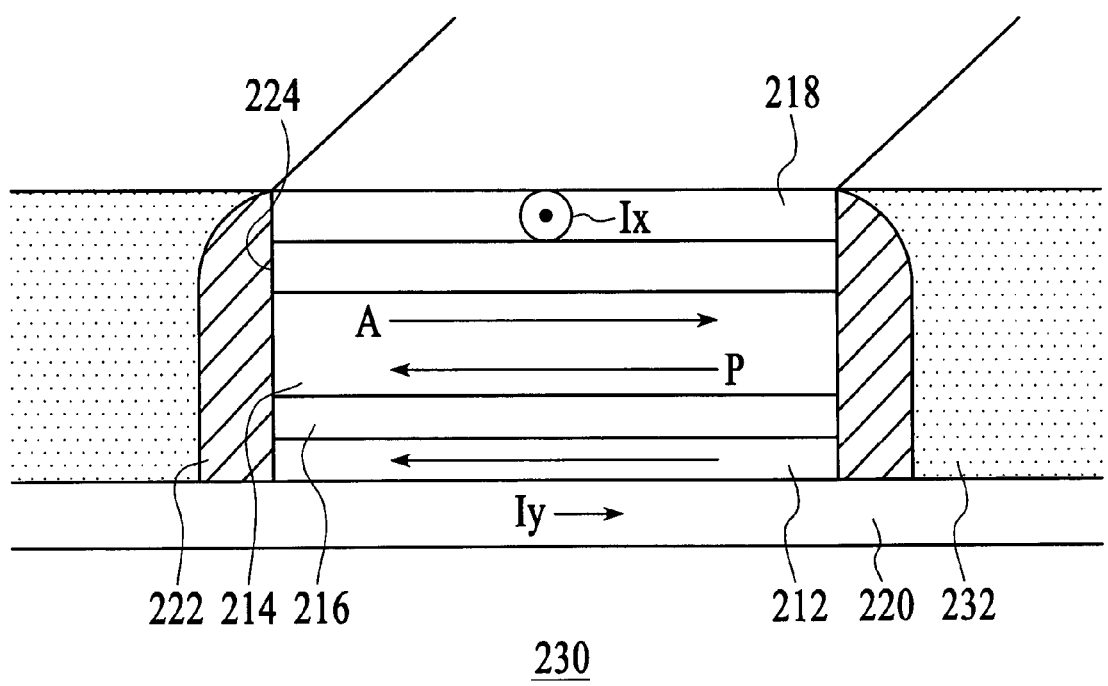
FIG. 2 shows an SDT junction in accordance with an embodiment of the present invention.

FIG. 2 shows an SDT junction 200. The SDT junction 200 includes a patterned group of thin film layers. This group includes a pinned layer 212 having a magnetization that is oriented in the plane of the pinned layer 212 but fixed by an anti-ferromagnetic pinning layer (not shown) so as not to rotate in the presence of an applied magnetic field in a range of interest. In an alternate embodiment, the pinned layer 212 is a synthetic ferromagnet pinned by an anti-ferromagnetic pinning layer.

The SDT junction 200 also includes a "free" layer 214 having a magnetization orientation that is not pinned. Rather, the magnetization can be oriented in either of two directions along an axis (the "easy" axis) lying in the plane of the free layer 214. Other layers such as seed layers, anti-ferromagnetic pinning layers and synthetic ferromagnetic layers, etc., may also be included in a SDT junction. If the magnetization of the pinned and free layers 212 and 214 are in the same direction, the orientation is said to be "parallel" (as indicated by the arrow P). If the magnetization of the pinned and free layers 212 and 214 are in opposite directions, the orientation is said to be "anti-parallel" (as indicated by the arrow A). It should also be pointed out that the free layer 214 is sometimes referred to as the data layer or the sense layer.

The pinned layer 212 and the free layer 214 are separated by an insulating tunnel barrier 216. Although the free layer 214 is shown in FIG. 2 as being above the tunneling barrier 216, the free layer 214 may be either above or below the tunnel barrier 216. The insulating tunnel barrier 216 allows quantum mechanical tunneling to occur between the pinned layer 212 and the free layer 214. This tunneling phenomenon is electron spin dependent, making the resistance of the SDT junction 200 a function of the relative orientations of the magnetization of the pinned layer 212 and the free layer 214. For instance, resistance of the SDT junction 200 is a function of the relative orientations of the magnetization of the pinned layer 212 and the free layer 214. Accordingly, resistance of the SDT junction 200 is a first value (R) if the magnetization orientation of the pinned layer 212 and the free layer 214 is parallel and a second value (R+ΔR) if the magnetization orientation is anti-parallel.

The junction 200 also includes a sense line 220 for sensing the resistance state of the SDT junction 200 during a read operation. Resistance of the SDT junction 200 is a function of the relative orientations of the magnetization of the pinned layer 212 and the free layer 214. For instance, resistance of the SDT junction 200 is a first value (R) if the magnetization orientation of the pinned layer 212 and the free layer 214 is anti-parallel and a second value (R+ΔR) if the magnetization orientation is parallel.

In an embodiment, the SDT junction 200 is deposited on a bottom conductor 230 typically formed by a damascene process. The SDT junction 200 includes a sidewall material 222 and a heater material 224 whereby the heater material 224 is located in between the sidewall material 222. It should be noted however that the heating can be accomplished in a variety of ways. Examples include voltage pulse, resistive hard mask, incorporating a third conductor, rf coupling, etc.

In an embodiment, the sidewall material 222 is a thermally conductive dielectric material such as SiN, AlN, DLC or any combination thereof.

Magnetic fields ($H_x$, $H_y$) may be applied to the SDT junction 200 by supplying current ($I_x$) through the conductor 222 and current ($I_y$) to the conductor 218. If the conductors 218 and 222 are orthogonal, the applied magnetic fields (Hx, Hy) will also be orthogonal.

When sufficiently large currents ($I_x$, $I_y$) are passed through the conductors 218 and 220 (e.g. during a write operation), the combined magnetic field ($H_x+H_y$) in the vicinity of the free layer 214 causes the magnetization of the free layer 214 to rotate from the parallel orientation to the anti-parallel orientation, or vice-versa. For example, a sufficient current $+I_x$ will cause the magnetization to be anti-parallel whereas a sufficient current $-I_x$ will cause the magnetization orientation to be parallel.

Figures 3, 4:
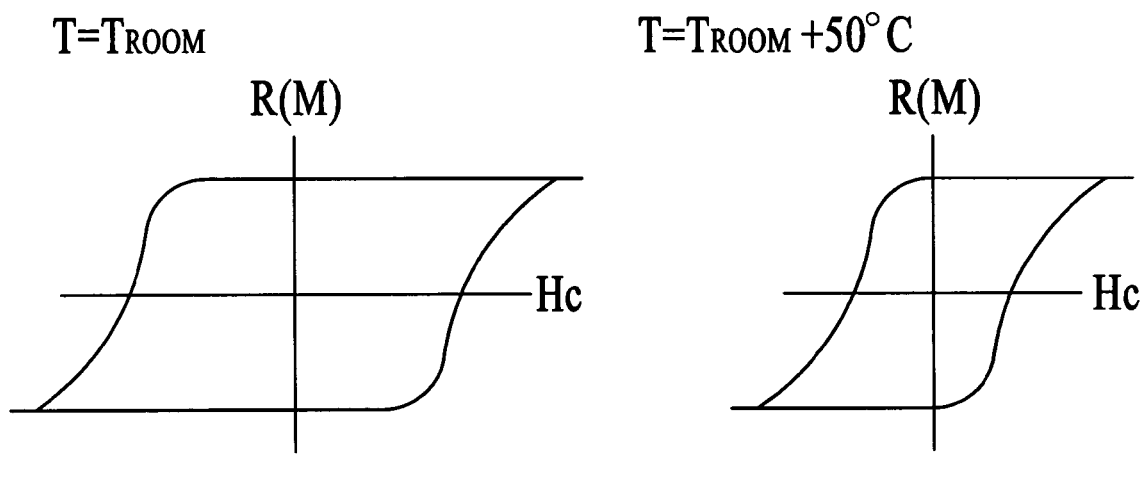
FIG. 3 shows the coercivity ($H_c$) of the SDT junction at room temperature.
FIG. 4 shows the coercivity ($H_c$) of the SDT junction at 50° C. above room temperature.

Current magnitudes may be selected so that the combined magnetic field ($H_x+H_y$) exceeds the switching field of the free layer 214 but does not exceed the switching field of the pinned layer 212. However, the magnitude of one or both write currents ($I_x$, $I_y$) may be reduced if the SDT junction 200 is heated. Coercivity of a magnetic film decreases with increasing temperature. Raising the temperature of the SDT junction 200 reduces the coercivity ($H_c$) of the SDT junction 200 as shown in FIGS. 3 and 4. FIG. 3 shows the coercivity ($H_c$) at room temperature while FIG. 4 shows the coercivity ($H_c$) at a temperature ΔT above room temperature. At the elevated temperature, the SDT junction 200 switches from a high resistance state to a low resistance state and vice-versa in the presence of a lower combined magnetic field ($H_x+H_y$). Therefore, heating the SDT junction 200 allows the magnitudes of one or both of the write currents ($I_x$, $I_y$) to be reduced. If, on the other hand, the magnitudes of the write currents ($I_x$, $I_y$) are not reduced, the SDT junction 200 will switch more reliably in the presence of the combined magnetic field ($H_x+H_y$). The temperature and write current can be varied to achieve a desired switching reliability.

Heat may be applied and removed before the combined magnetic field ($H_x+H_y$) is applied, or the heat may be applied at the same time as the combined magnetic field ($H_x+H_y$). The free layer 214 may be heated to about 0° C. to 50° C. above room temperature. More generally, the maximum heating temperature may be about 50° C. less than the Blocking temperature $T_B$ (the temperature above which the pinning properties are lost). However, one of ordinary skill in the art will readily recognize that the free layer 214 can be heated to any temperature.

Additionally, an electrically and thermally isolating dielectric layer 232 is included for isolating the heat from neighboring SDT junctions. In an embodiment, the electrically and thermally isolating dielectric layer 232 is at least one of $Al_2O_3$, DLC and $SiO_2$.

Heat is applied to the free layer 214 by connecting a power source to the heater material 224. In an embodiment, the power source is a high frequency AC power source coupled to a decoder. The frequency can be a radio frequency or any other of a variety of frequencies that are empirically determined. In varying embodiments, the heater material 224 is amorphous carbon or amorphous silicon or a metallic material. Accordingly, prior to or simultaneous with the performance of a write operation (i.e. the application of a write current), the power source supplies energy to the heater material 224. The energy from the power source is then transferred from the heater material 224. Accordingly, because the sidewall material 222 is thermally conductive, heat is transferred evenly to layers 212-220. Consequently, once heated, the free layer 214 requires significantly lower write currents to switch the magnetization state.

It should be noted that one of the advantages of employing a thermally conductive sidewall material 222 is that the heater material 224 does not have to be in direct contact with the sense layer 220 to be effective. This allows the heater material 224 to be placed above the sense layer 212 as shown in FIG. 2 or anywhere in the materials stack so long as the heater material is not between the sense layer and the tunnel barrier. This decreases the roughness factor of the sense layer 212 since there is one less layer of material (e.g. the heater material 224) beneath it. Consequently, by decreasing the roughness factor, an increase is achieved in the ferromagnetic coupling.

Figure 5:
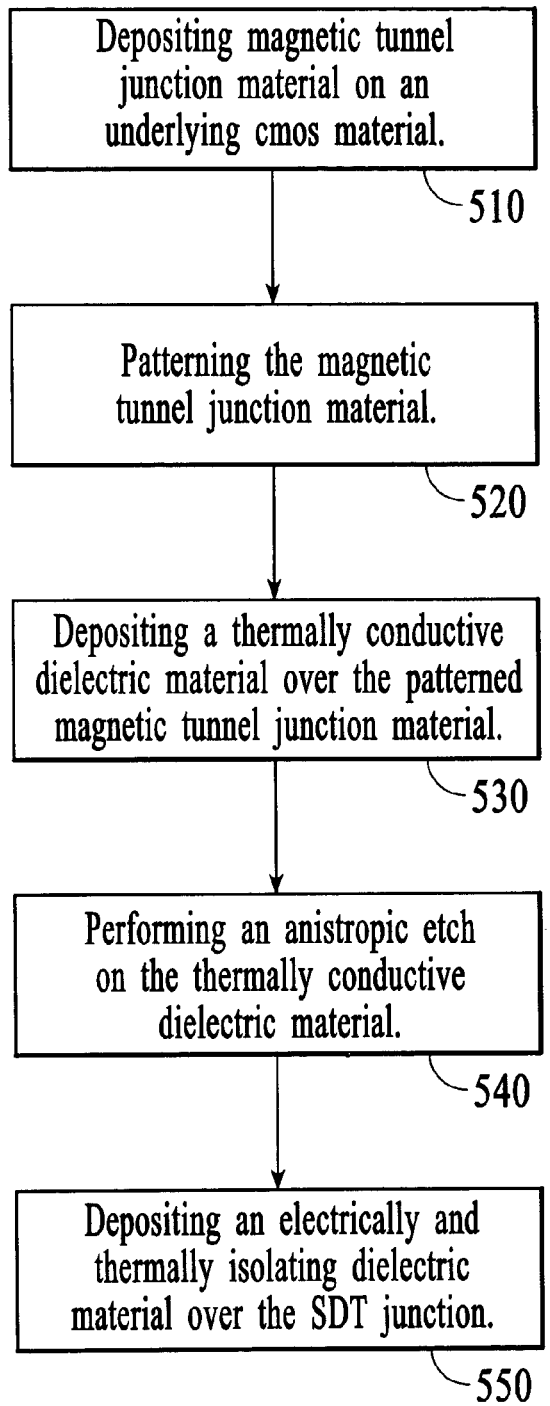
FIG. 5 is a flow chart illustrating the method steps for fabricating a magnetic random access memory array in accordance with an embodiment of the present invention.
Figure 5:
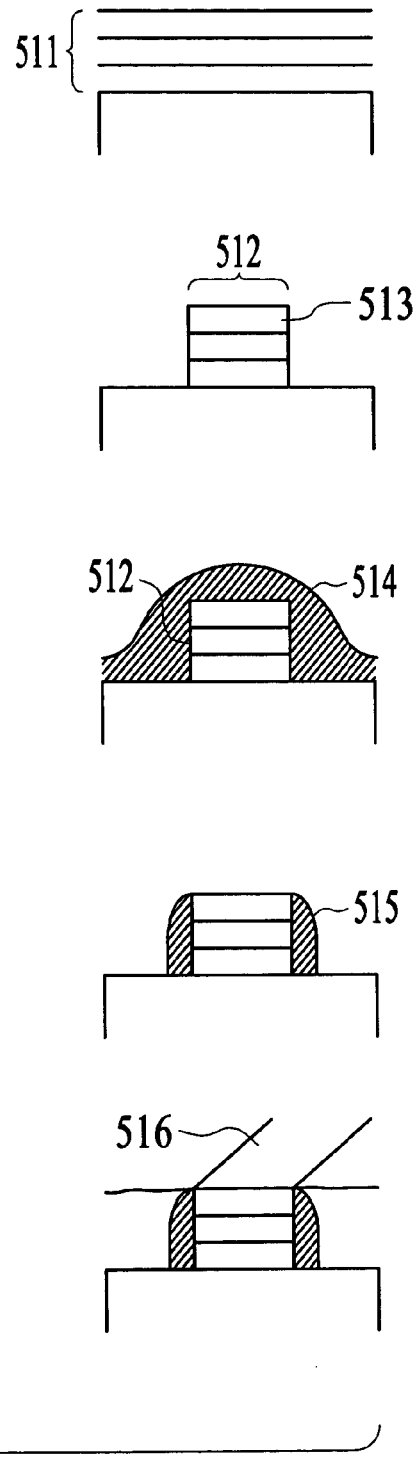

Please refer now to FIG. 5. FIG. 5 is a flow chart illustrating the method steps for fabricating a magnetic random access memory array in accordance with an embodiment along with a series of cross sectional views (FIGS. 5(a-e)) showing the resulting structure.

A first step 510 includes depositing magnetic tunnel junction material 511 on an underlying CMOS material. The magnetic tunnel junction material 511 includes a heater material and any of a variety of magnetic tunnel junction material. A second step 520 includes patterning the magnetic tunnel junction material 512. A third step 530 includes depositing a thermally conductive and electrically isolating dielectric material 514 over the patterned magnetic tunnel junction material 512. A thermally conductive dielectric material such as SiN, AlN and DLC or any combination thereof is used in this step.

The next step 540 includes performing an anisotropic etch on the thermally conductive material 514. Since the etching process in step 540 is anisotropic, meaning that it removes material directionally, this step clears the conductive material 514 thereby leaving the conductive material as sidewall material 515.

A next step 550 includes depositing an electrically and thermally isolating dielectric material 516 over the SDT junction. In an embodiment, the electrically and thermally isolating dielectric material 516 is at least one of $Al_2O_3$, DLC and $SiO_2$. Additionally, an optional step includes polishing the isolating dielectric material 516 to expose the top layer of the junction.

Figure 6:
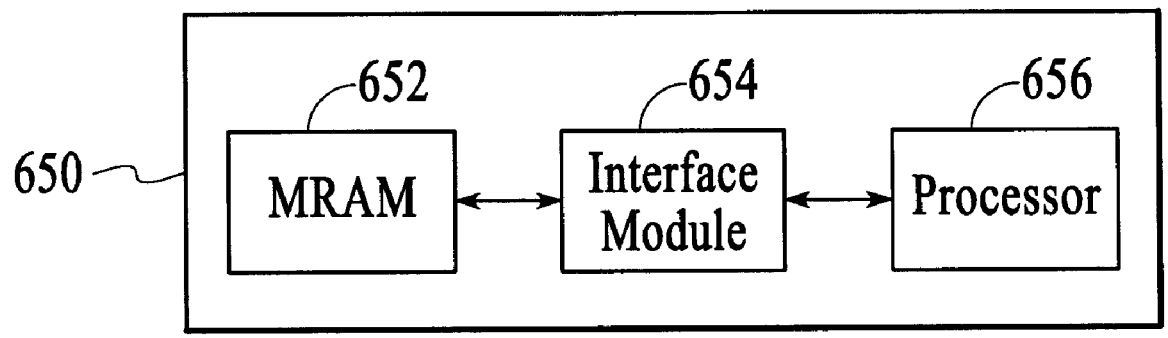
FIG. 6 shows an exemplary general application for an MRAM device in accordance with an embodiment of the present invention.

The MRAM device described herein may be used in a variety of applications. FIG. 6 shows an exemplary general application for an MRAM device. The general application is embodied by a system 650 including an MRAM device 652, an interface module 854 and a processor 656. Interface module 654 provides an interface between processor 656 and MRAM device 652. System 650 could also include other types and/or levels of memory.

For a system 650 such as a notebook computer or personal computer, the interface module 654 might include an IDE or SCSI interface. For a system 650 such as a server, multiple MRAM devices could be implemented and interface module 654 might include a fiber channel or SCSI interface. For a device 650 such as a digital camera, the interface module 654 might include a camera interface. Here, the MRAM device 654 would allow non-volatile storage of digital images on-board the digital camera.

The above embodiments of the MRAM device may offer advantages over other MRAM devices. For example, a higher level of memory cell densities may be achieved compared to other MRAM devices that include additional elements. Increased densities may result in decreased costs for a given amount of storage capacity. In addition the memory cell strings described herein may provide better electrical circuit isolation compared to previous MRAM devices. The improved isolation may allow for more reliable detection of the state of memory cells in a memory cell string.

The MRAM device in accordance with an embodiment may also be used for long-term data storage in a computer. Such a device offers many advantages (e.g. faster speed, smaller size) over hard drives and other conventional long-term data storage devices. Additionally, the MRAM device according to an embodiment can possibly replace DRAM and other fast, short-term memory in computers.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

Although the above-described embodiments are disclosed in conjunction with the operation of an MRAM device, it should be understood that the above-disclosed configurations could be implemented in conjunction with a variety of different thin film devices while remaining within the spirit and scope of the present invention. Consider an example of a chemical sensor. So called "Laboratory on a Chip" thin film devices utilize chemical reactions to analyze specimens. The rate of the chemical reactions are exponentially dependent on temperature. Accordingly, by heating the specimen, the rate of the chemical reaction is increased, and the time in which the results are obtained is decreased.

A thin film device and a method of providing thermal assistance therein is disclosed. Accordingly, a heater material is utilized in conjunction with an electrically isolating and thermally conducting material to thermally assist in the operation of the thin film device. By utilizing a heater material in conjunction with an electrically and thermally isolating material to thermally assist in the operation of the thin film device, a substantial improvement in the accuracy and performance of the thin film device is achieved. In addition, the device can be operated at a lower current thereby lowering the cost of producing such device. Furthermore, employing a electrically isolating and thermally conducting material allows the heater material to be positioned anywhere in the thin film device thereby increasing the flexibility of the fabrication process.

Without further analysis, the foregoing so fully reveals the gist of the present invention that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although this invention has been described in terms of certain embodiments, other embodiments that are apparent to those of ordinary skill in the art are also within the scope of this invention, as defined in the claims that follow.

What is claimed:

1. An integrated circuit memory device, comprising:
an array of magnetic random access memory (MRAM) cells, said array comprising at least one memory cell having a free layer therein with a variable magnetic orientation, said free layer covered on a first side by a patterned heater layer, which is configured to heat the first side of said free layer in response to connecting the patterned heating layer to a power source in advance of writing data into the at least one memory cell, and covered on second and third opposing sides by thermally conductive and electrically insulating materials, which are configured to transfer heat from the patterned heater layer to sidewalls of the free layer.

2. The device of claim 1, wherein the patterned heater layer comprises a material selected from a group consisting of amorphous carbon and amorphous silicon.

3. The device of claim 1, further comprising an electrically and thermally isolating material configured to isolate the heat from neighboring spin dependent tunneling (SDT) junctions.

* * * * *